(12) United States Patent
Kimura

(10) Patent No.: US 7,719,360 B2
(45) Date of Patent: May 18, 2010

(54) VARIABLE GAIN CIRCUIT

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 73 days.

(21) Appl. No.: 12/222,835

(22) Filed: Aug. 18, 2008

(65) Prior Publication Data

US 2009/0051430 A1    Feb. 26, 2009

(30) Foreign Application Priority Data

Aug. 24, 2007    (JP) .............................. 2007-218401

(51) Int. Cl.
    *H03F 3/45*      (2006.01)
(52) U.S. Cl. .......................... 330/254; 330/133; 330/278
(58) Field of Classification Search ................. 330/254, 330/133, 278
See application file for complete search history.

(56) References Cited

U.S. PATENT DOCUMENTS

| | | | | |
|---|---|---|---|---|
| 5,463,348 | A * | 10/1995 | Sarpeshkar et al. ......... | 330/253 |
| 6,298,466 | B1 * | 10/2001 | Dasgupta ...................... | 716/1 |
| 6,744,319 | B2 * | 6/2004 | Kim ............................ | 330/254 |
| 6,803,819 | B2 * | 10/2004 | Kim ............................ | 330/254 |
| 6,867,650 | B2 | 3/2005 | Kimura | |
| 7,391,260 | B2 * | 6/2008 | Kim et al. ..................... | 330/86 |
| 7,557,657 | B2 * | 7/2009 | Quoc et al. .................. | 330/254 |
| 2003/0107438 | A1 | 6/2003 | Kimura | |

FOREIGN PATENT DOCUMENTS

JP      2003-179447      6/2003

* cited by examiner

*Primary Examiner*—Patricia Nguyen
(74) *Attorney, Agent, or Firm*—McGinn IP Law Group, PLLC

(57) ABSTRACT

Disclosed is a variable gain circuit, which operates in a region where the gain varies substantially exponentially with respect to a control voltage, having an operation region in which the gain varies substantially with an exponential function $$\{(\sqrt{1-x}-\sqrt{2})^2+K\}/\{(\sqrt{1+x}-\sqrt{2})^2+K\}$$

where $0 \leq K \leq 1$ and x is a variable corresponding to the control voltage. The denominator and the numerator of the above function are given by a first sum current and a second sum current, respectively. The first sum current is a sum of the drain current of a first transistor and a constant current, and the second sum current is a sum of the drain current of a second transistor and the constant current. The first and second transistors have sources grounded, having gates connected common and supplied with a bias voltage, and having back-gates supplied with control voltages differentially.

9 Claims, 8 Drawing Sheets

VARIABLE GAIN CIRCUIT

REFERENCE TO RELATED APPLICATION

This application is based upon and claims the benefit of the priority of Japanese patent application No. 2007-218401 filed on Aug. 24, 2007, the disclosure of which is incorporated herein in its entirety by reference thereto.

TECHNICAL FIELD

This invention relates to a variable gain amplifier (VGA) and, more particularly, to a variable gain amplifier in which the gain varies exponentially with respect to a control signal, the operation is from a low voltage and both the range of the operation and the dynamic range are broad, and which may be formed to advantage on a semiconductor integrated circuit.

BACKGROUND

Heretofore, the variable gain circuit of this type was fabricated in many cases based on an approximation, termed a bilinear transform relation, represented by the following approximation (1):

$$e^{2x} \approx \frac{1+x}{1-x} = 1 + 2x + 2x^2 + 2x^3 + \ldots \quad (-1 < x < 1) \tag{1}$$

With the bilinear transform relation, shown by the above relation (1), attention is to be directed to the fact that it is not $e^x$ but $e^{2x}$ that the relation approximates.

On the other hand, an exponential function is represented by $$e^x = 1 + x + \frac{x^2}{2} + \frac{x^3}{6} + \ldots + \frac{x^n}{n!} + \ldots \tag{2}$$

and also is represented by $$e^x = \frac{1 + \tanh(x/2)}{1 - \tanh(x/2)} \tag{3}$$

as an identity that exploits a hyperbolic function (tan h(x)).

This identity also appears in a set of formulas and may be found with ease from the well-known definition of the hyperbolic function (tan h(x)) by the following equation:

$$\tanh(x) = \frac{e^x - e^{-x}}{e^x + e^{-x}} \tag{4}$$

That is, the following equation:

$$e^{2x} = \frac{1 + \tanh(x)}{1 - \tanh(x)} \tag{5}$$

may be arrived at with ease.

However, as far as the present inventor is aware, the above equation (3) or (5) has not been disclosed in treatises or Patent Documents directed to the variable gain circuit with the exponentially varying gain, with the exception of Patent Document 1 (JP Patent Kokai Publication No. JP-P2003-179447A) by the same inventor as the present inventor.

Comparing the equations (2) and (1), it may readily be surmised that the approximation error will become larger.

For example, if the equation (5) is approximated to $$\tanh(x) \approx x + \frac{x^3}{3} \quad (|x| << 1) \tag{6}$$

we obtain $$e^{2x} = \frac{1 + \tanh(x)}{1 - \tanh(x)} \approx \frac{1 + x + \frac{x^3}{3}}{1 - x - \frac{x^3}{3}} \tag{7}$$

The relationship between the original function $e^{2x}$ and its approximations (1) and (7) is shown in FIG. 1, from which it is apparent that the approximation error of the bilinear transform relation, represented by the approximation (1), is of a significantly large value. It is also noted that the bilinear transform relation, represented by the approximation (1), is to be used as an approximation for the exponential function $e^{2x}$ in a range of x of approximately $-0.5 < x < 0.5$.

Thus, if a circuit is fabricated on the basis of the approximation termed the bilinear transform approximation (1), the approximation error becomes larger and cannot be decreased except by narrowing down the range of the input voltage.

[Patent Document 1] JP Patent Kokai Publication No. JP-P2003-179447A

SUMMARY

The entire disclosure of Patent Document 1 is incorporated herein by reference thereto.

The following analysis has been given according to the present invention.

The variable gain circuit, fabricated on the basis of the aforementioned conventional bilinear transform approximation, suffers from the following problems:

The first problem is that the dynamic range cannot be made broader because the bilinear transform approximation causes a large approximation error.

The second problem is that the variable width of the control voltage cannot but be set to narrower values. The reason for this is that since the approximation error of the bilinear transform approximation is large, the range of the operation needs to be set narrower.

It is an object of the present invention to provide a variable gain circuit with a smaller approximation error and a broader dynamic range. Another object of the present invention is to provide a variable gain circuit in which an operating range is broader and in which it is unnecessary to set the variation width of a control voltage to a narrow value.

The invention disclosed by the present application may be summarized substantially as follows:

In one aspect of the present invention, there is provided a variable gain circuit which operates in a region in which a gain thereof varies substantially as an exponential function of a control voltage applied thereto, wherein, the circuit has an operation region, in which the gain varies substantially exponentially, based on a function:

$$\{(\sqrt{1-x}-\sqrt{2})^2+K\}/\{(\sqrt{1+x}-\sqrt{2})^2+K\} \quad (0 \leq K \leq 1)$$

where x is a variable corresponding to the control voltage.

In the present invention, the parameter K in the above function is of a value of approximately from 0.01 to 0.03 including 0.0133 or 0.026.

In the present invention, the denominator and the numerator of the above function are proportionate to driving currents of two respective operational transconductance amplifiers (OTAs).

In the present invention, the denominator and the numerator of the above function are sum currents of the drain currents of two transistors, and constant currents. These transistors have sources connected to a power supply, while having gates connected common and supplied with a bias current, and having back-gates supplied with differential input voltages.

In another aspect of the present invention, there is provided variable gain circuit including a first OTA (operational transconductance amplifier) differentially receiving an input voltage at first and second input terminals thereof, and a second OTA having first and second input terminals connected to first and second output terminals of the first OTA, respectively. The first input terminal and the first output terminal of the second OTA are connected to each other, while the second input terminal and the second output terminal of the second OTA are connected to each other. The gain of the variable gain circuit is given by gm1/gm2, where gm1 is the transconductance of the first OTA and gm2 is the transconductance of the second OTA. The transconductance of each of the OTAs is proportionate to a driving current for each OTA or a square root thereof. The variable gain circuit also includes first and second MOS transistors, having sources connected common and connected to a power supply, having gates supplied with a common bias voltage and having back-gates differentially supplied with a control voltage. The sum of the drain current of the first MOS transistor and a constant current is supplied as a first driving current to the first OTA. The sum of the drain current of the second MOS transistor and the constant current is supplied as a second driving current to the second OTA. According to the present invention, assuming that the control voltages differentially supplied to the back-gates of the first and second MOS transistors are $V_{CN}+V_{CNT}$, and $V_{CN}-V_{CNT}$, respectively, the first driving current corresponding to the sum of the drain current $I_{D1}$ of the first MOS transistor and the constant current $I_K$ is $I_{CON1}$, and the second driving current $I_{D2}$ corresponding to the sum of the drain current $I_{D2}$ of the second MOS transistor and the constant current $I_K$ is $I_{CON2}$, the ratio of $I_{CON1}$ to $I_{CON2}$ is given by $$\frac{I_{CON1}}{I_{CON2}} = \frac{\left[\sqrt{1-\frac{V_{CNT}}{|\phi_F|}}-\sqrt{2}\right]^2 + \frac{I_K}{\beta\gamma^2|\phi_F|}}{\left[\sqrt{1+\frac{V_{CNT}}{|\phi_F|}}-\sqrt{2}\right]^2 + \frac{I_K}{\beta\gamma^2|\phi_F|}}$$

where $\phi_F$ is the strong inversion surface potential, $\beta$ is a gain coefficient and $\gamma$ is a bulk threshold parameter.

According to the present invention, the dynamic range of the variable gain circuit can be made broader by a newly set function that approximates an exponential function.

According to the present invention, the approximation error may be set to an extremely small value. The reason is that an approximation with an intrinsically extremely small approximation error is used, differential signals are delivered from the back-gates of the transistors, and the gate bias voltage is set, thereby finely implementing the characteristics of the approximation. Thus, according to the present invention, the dynamic range may be made broader, while it is unnecessary to set the width of variations of the control voltage to narrower values.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

Figure 1:
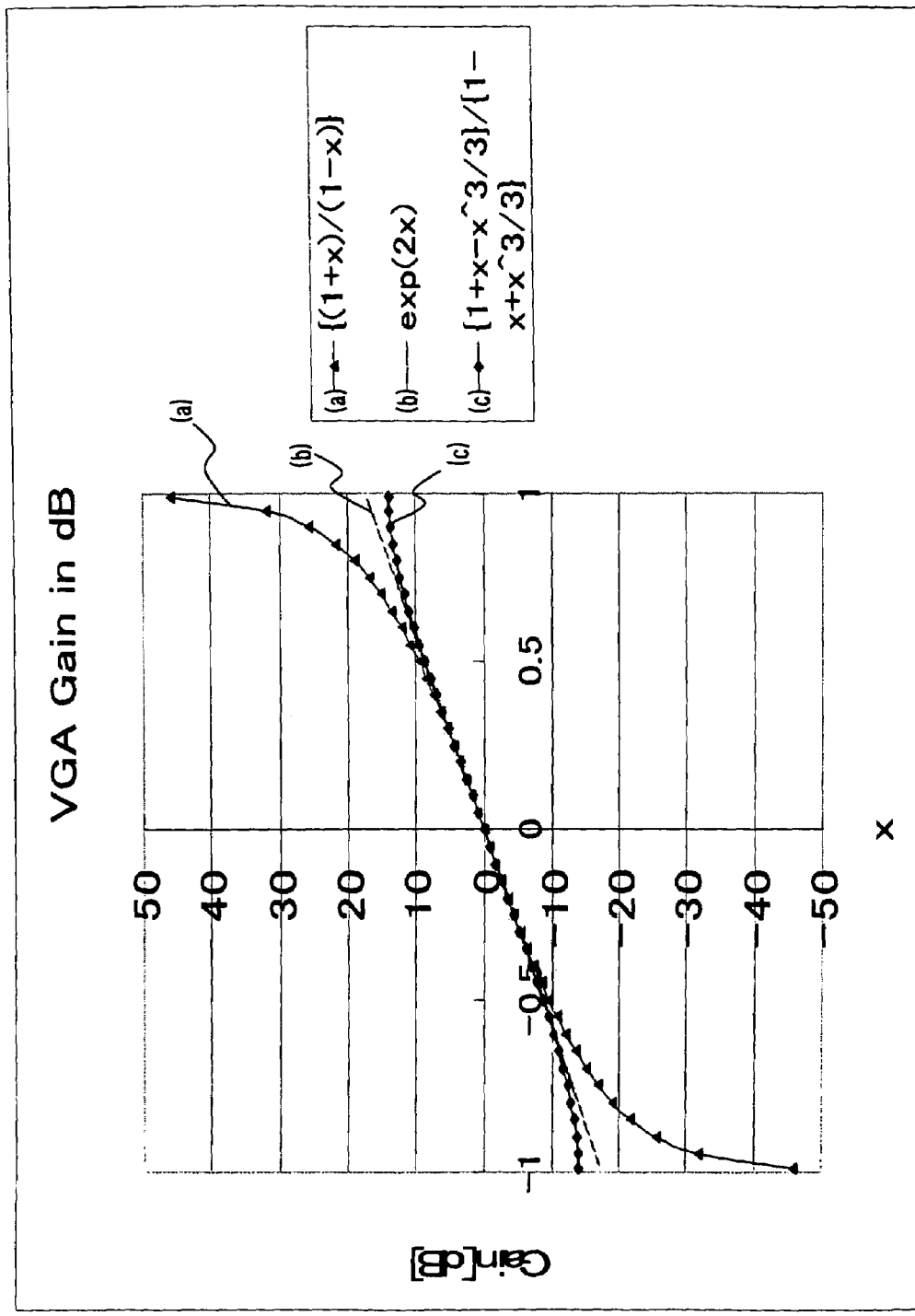
FIG. 1 is a graph for illustrating a bilinear transform relation and its approximations.

The principle of operation of the present invention will be first described and then exemplary embodiments will be described.

An exponential function is represented by the equation (2). By this equation, $e^{-x}$ is represented by the following equation:

$$e^{-x} = 1 - x + \frac{x^2}{2} - \frac{x^3}{6} + \ldots + (-1)^n \frac{x^n}{n!} + \ldots \quad (8)$$

Hence, using $e^x$ and $e^{-x}$, $e^{2x}$ may be represented by $$e^{2x} = \frac{e^x}{e^{-x}} = \frac{1+x+\frac{x^2}{2}+\frac{x^3}{6}+\ldots+\frac{x^n}{n!}+\ldots}{1-x+\frac{x^2}{2}-\frac{x^3}{6}+\ldots+(-1)^n\frac{x^n}{n!}+\ldots} \quad (9)$$

If, in the equation (9), approximation for both $e^x$ and $e^{-x}$ is up to the terms of $x^3$, the following relation:

$$e^{2x} = \frac{e^x}{e^{-x}} \approx \frac{1+x+\frac{x^2}{2}+\frac{x^3}{6}}{1-x+\frac{x^2}{2}-\frac{x^3}{6}} \quad (10)$$

may be obtained. With this relation, the approximation error may be expected to be smaller than with the approximation (7).

Or, if approximation for $e^x$ and $e^{-x}$ is only up to the terms of $x^2$, the following relation:

$$e^{2x} = \frac{e^x}{e^{-x}} \approx \frac{1+x+\frac{x^2}{2}}{1-x+\frac{x^2}{2}} = \frac{(1+x)^2+1}{(1-x)^2+1} \quad (11)$$

may be obtained.

Figure 2:
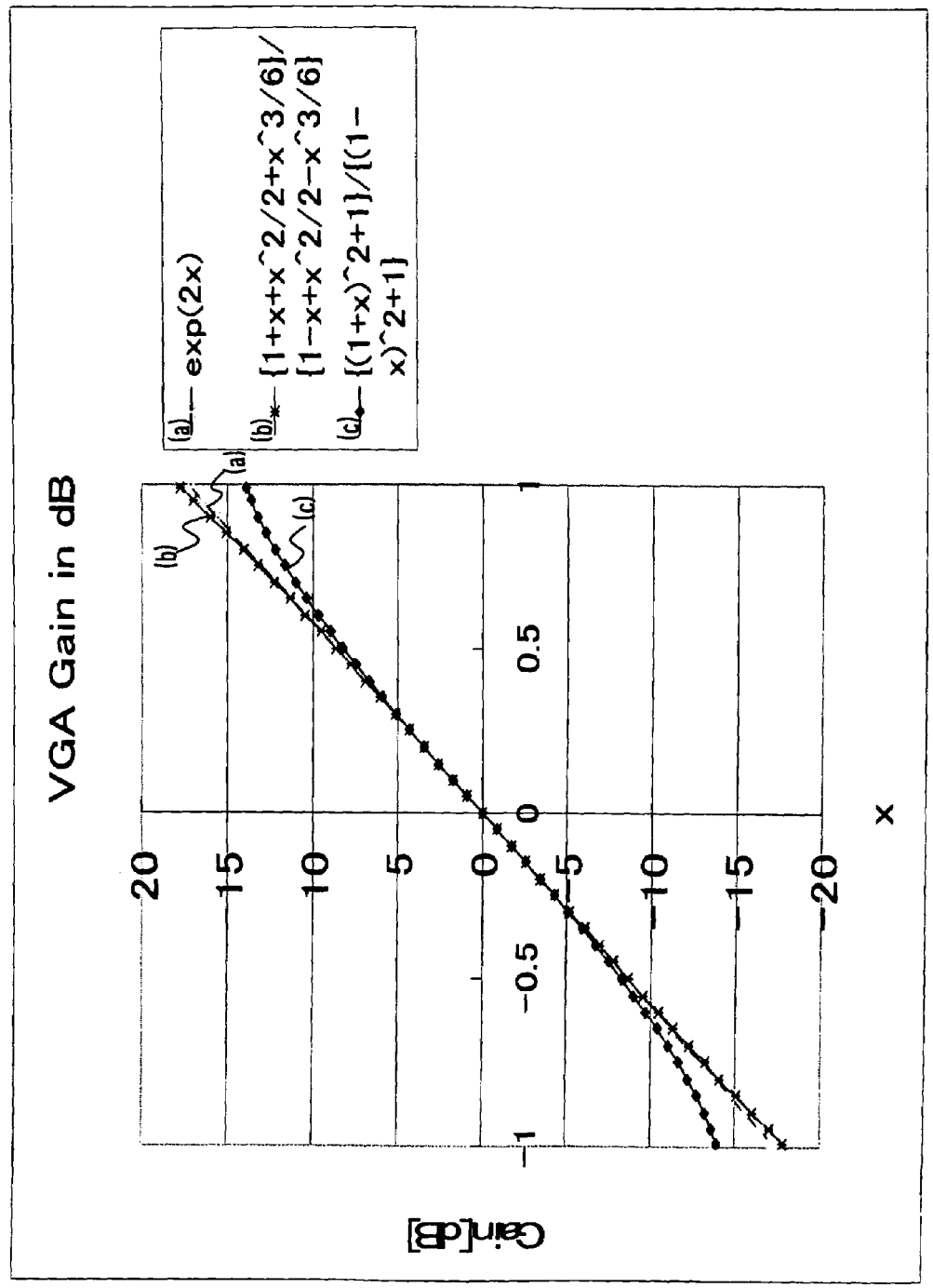
FIG. 2 is a graph for illustrating an exponential function and its approximations up to the second and third order terms of x.

The approximations (10) and (11) are shown in FIG. 2.

As may be anticipated, the approximation error of the approximation (11) is greater than that of the approximation (10). Nevertheless, the former approximation error is smaller than the approximation error of the bilinear transform approximation (1).

It may also be surmised that a constant +1 is rather effective in the approximation (11). The reason is that, if this constant +1 is removed, that is, zeroed, the approximation (11) reduces to $(1+x)^2/(1-x)^2$, which is simply a squared version of the bilinear transform equation (1). In this case, simply the gradient of the curve for $(1+x)/(1-x)$ of FIG. 1 is further doubled.

If, with a view to implementing a variable gain circuit having a log-linear characteristic, exhibiting good linearity, that is, an exponential characteristic, an approximation is found as described above, and the characteristic as shown by the approximation is implemented by an actual electronic circuit, it goes without saying that, as a postulate, the approximation error of the approximation used is small.

It also goes without saying that, if desired to reduce the approximation error, it suffices to leave as many higher order terms of x of the denominator and x of the numerator in the equation (9) as possible. However, the problem then arises as to whether the circuit in such case can readily be implemented.

It is a matter of course that the lower the orders of x, the smaller may be the size of the implementing circuit. In particular, if approximation is up to only the second order term of x, a squaring circuit may be used, whereas, if approximation is up to the third order term of x, a tripling circuit would be needed. In the latter case, the circuit is complex in structure, thus possibly increasing the circuit size.

In light of the above, the following approximation of an exponential function:

$$f(x) = \frac{\left(\sqrt{1-x}-\sqrt{2}\right)^2+K}{\left(\sqrt{1+x}-\sqrt{2}\right)^2+K} \quad (12)$$

is now taken up for consideration.

Since $$\sqrt{1 \pm x} \approx 1 \pm \frac{1}{2}x - \frac{1 \cdot 1}{2 \cdot 4}x^2 \pm \frac{1 \cdot 1 \cdot 3}{2 \cdot 4 \cdot 6}x^3 - \frac{1 \cdot 1 \cdot 3 \cdot 5}{2 \cdot 4 \cdot 6 \cdot 8}x^4 \ldots \quad (|x| \le 1) \quad (13)$$

it may be understood that higher order terms of x are included in the approximation (12), and hence the use of this approximation may be expected to contribute to reducing the approximation error of the exponential function.

That is, substitution of the relation (13) into the relation (12) gives:

$$f(x) = \frac{\left(\sqrt{1-x}-\sqrt{2}\right)^2+K}{\left(\sqrt{1+x}-\sqrt{2}\right)^2+K} \quad (14)$$

$$= \frac{3+K-x-2\sqrt{2}\sqrt{1-x}}{3+K+x-2\sqrt{2}\sqrt{1+x}}$$

$$\approx \frac{(3-2\sqrt{2})+K+(\sqrt{2}-1)x+\frac{1}{2\sqrt{2}}x^2+\frac{1}{4\sqrt{2}}x^3+\frac{5}{96\sqrt{2}}x^4\ldots}{(3-2\sqrt{2})+K-(\sqrt{2}-1)x+\frac{1}{2\sqrt{2}}x^2-\frac{1}{4\sqrt{2}}x^3+\frac{5}{96\sqrt{2}}x^4\ldots}$$

The above relation may be rewritten as follows:

$$f(x) \approx \frac{\frac{(3-2\sqrt{2})+K+(\sqrt{2}-1)x+\frac{1}{2\sqrt{2}}x^2+\frac{1}{4\sqrt{2}}x^3+\frac{5}{96\sqrt{2}}x^4\ldots}{(3-2\sqrt{2})+K-(\sqrt{2}-1)x+\frac{1}{2\sqrt{2}}x^2-\frac{1}{4\sqrt{2}}x^3+\frac{5}{96\sqrt{2}}x^4\ldots}}{} \quad (15)$$

$$= \frac{\frac{(3-2\sqrt{2})+K}{\sqrt{2}-1}+x+\frac{1}{2\sqrt{2}(\sqrt{2}-1)}x^2+\frac{1}{4\sqrt{2}(\sqrt{2}-1)}x^3+\frac{5}{96\sqrt{2}(\sqrt{2}-1)}x^4\ldots}{\frac{(3-2\sqrt{2})+K}{\sqrt{2}-1}-x+\frac{1}{2\sqrt{2}(\sqrt{2}-1)}x^2-\frac{1}{4\sqrt{2}(\sqrt{2}-1)}x^3+\frac{5}{96\sqrt{2}(\sqrt{2}-1)}x^4\ldots}$$

$$= \frac{0.4142+0.4142K+x+0.85355x^2+0.42678x^3+0.01778x^4\ldots}{0.4142+0.4142K-x+0.85355x^2-0.42678x^3+0.01778x^4\ldots}$$

The equation (9), for example, may be rewritten to $$e^{2x} = \frac{e^x}{e^{-x}} = \frac{1+x+0.5x^2+0.1667x^3+0.0417x^4+\ldots}{1-x+0.5x^2-0.1667x^3+0.0417x^4-\ldots} \quad (16)$$

in which the coefficients differ from those of the equation (15).

However, if the coefficient 2 of the exponential term 2x is of a greater value than 2, the equation (15) may be used as an approximation of the exponential function.

Figure 3:
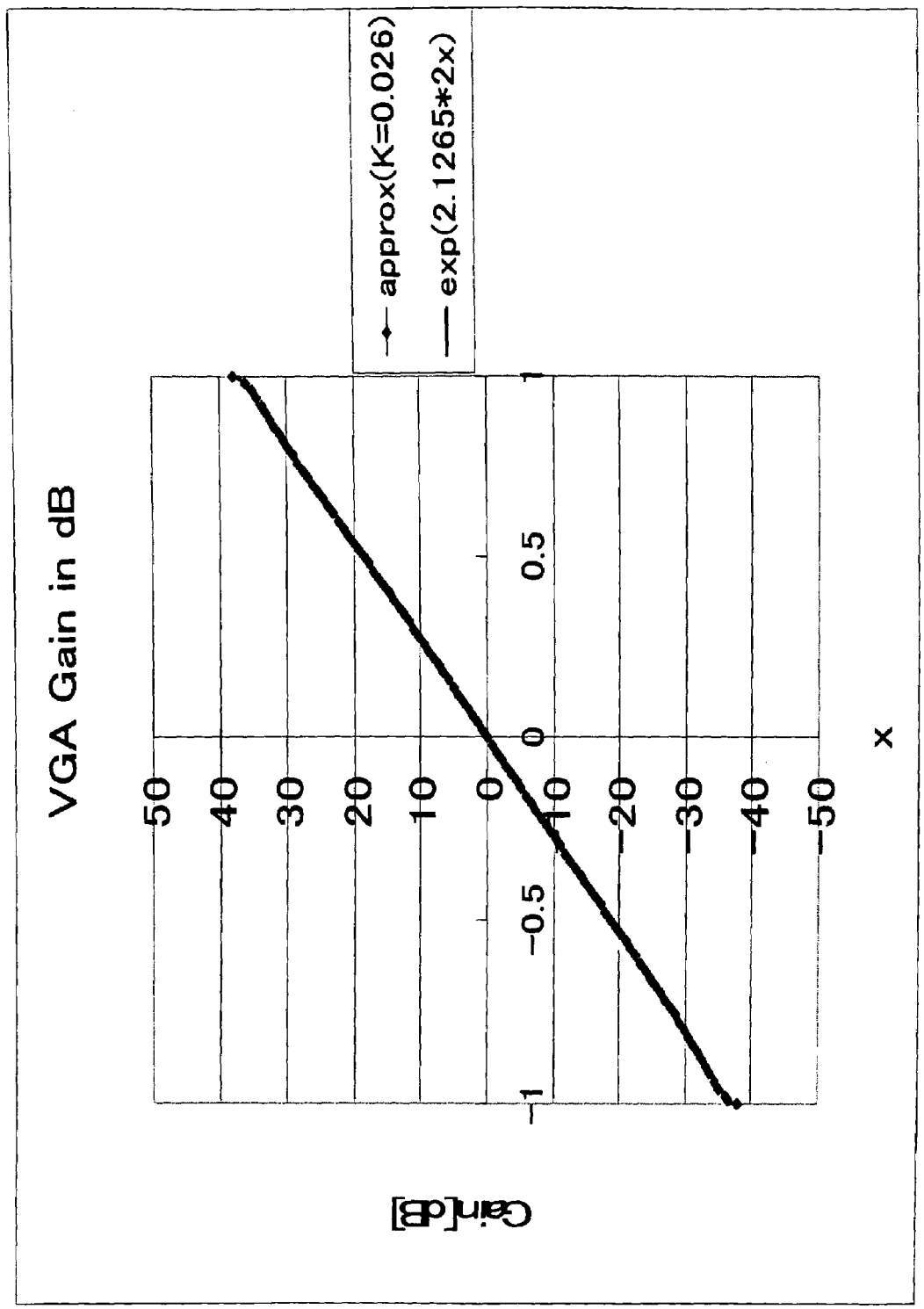
FIG. 3 is a graph for illustrating a first approximation used in the present invention.

Referring to FIG. 3, if K is set so that K=0.026, the approximation (12) approximates $e^{4.253x}$ (solid line of FIG. 3), with the approximation error being not greater than 0.31 dB for a range of x of $-0.99 \leq x \leq 0.99$. The gain width of 73 dB ($\pm 36.5$ dB) is assured.

The error may be increased slightly to increase the gain width. If, as a concrete example, K is set so that K=0.0133, the approximation (12) approximates $e^{4.8426x}$ (solid line of FIG. 4). For a range of x such that $-0.99 \leq x \leq 0.99$, the approximation error is not greater than 0.80 dB, and the gain width of 83 dB ($\pm 41.5$ dB) is assured.

In the following example, a method for implementing a concrete circuit, approximating an exponential characteristic with the use of the equation (12), is described.

Figure 5:
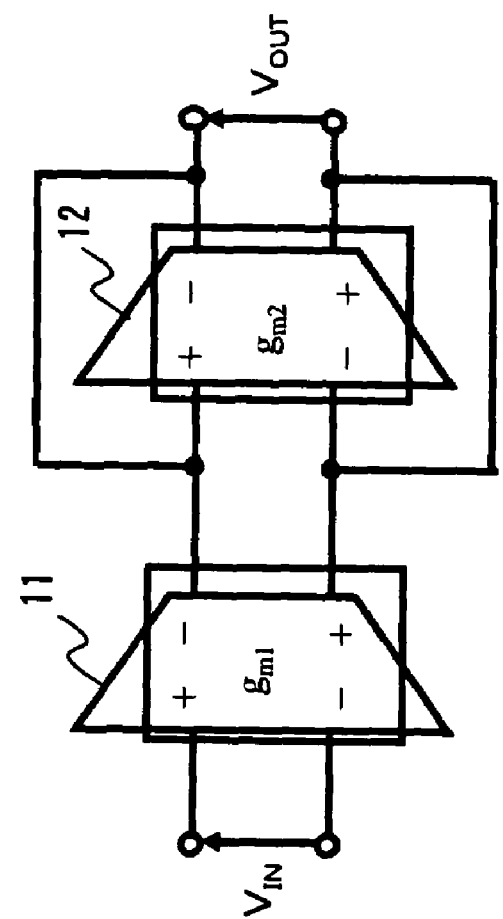
FIG. 5 is a diagram showing a configuration of a variable gain circuit as used in the present invention.

In constructing the variable gain circuit, which is based on the equation (12), such a method may be applied which uses two OTAs (operational transconductance amplifiers) shown in FIG. 5. That is, a voltage gain $G=V_{OUT}/V_{IN}$ of the variable gain circuit may be expressed as $$G = g_{m1}/g_{m2} \quad (17)$$

That is, referring to FIG. 5, the variable gain circuit includes a first OTA 11, having first and second input terminals (+ and −) receiving a differential input voltage $V_{IN}$, and first and second output terminals outputting a differential output current. The variable gain circuit also includes a second OTA 12, having first and second input terminals (+ and −) connected to the first and second output terminals of the first OTA 11, respectively, and first and second output terminals (− and +). With the second OTA 12, the first input terminal (+) and the first output terminal (−) are connected to each other, while the second input terminal (−) is connected to the second output terminal (+). With differential output currents $I_+$ and $I_-$ of the first OTA 11, $\Delta I = I_+ - I_- = gm1 V_{IN} = gm2 V_{OUT}$, so that $G = V_{OUT}/V_{IN} = gm1/gm2$.

Figure 4:
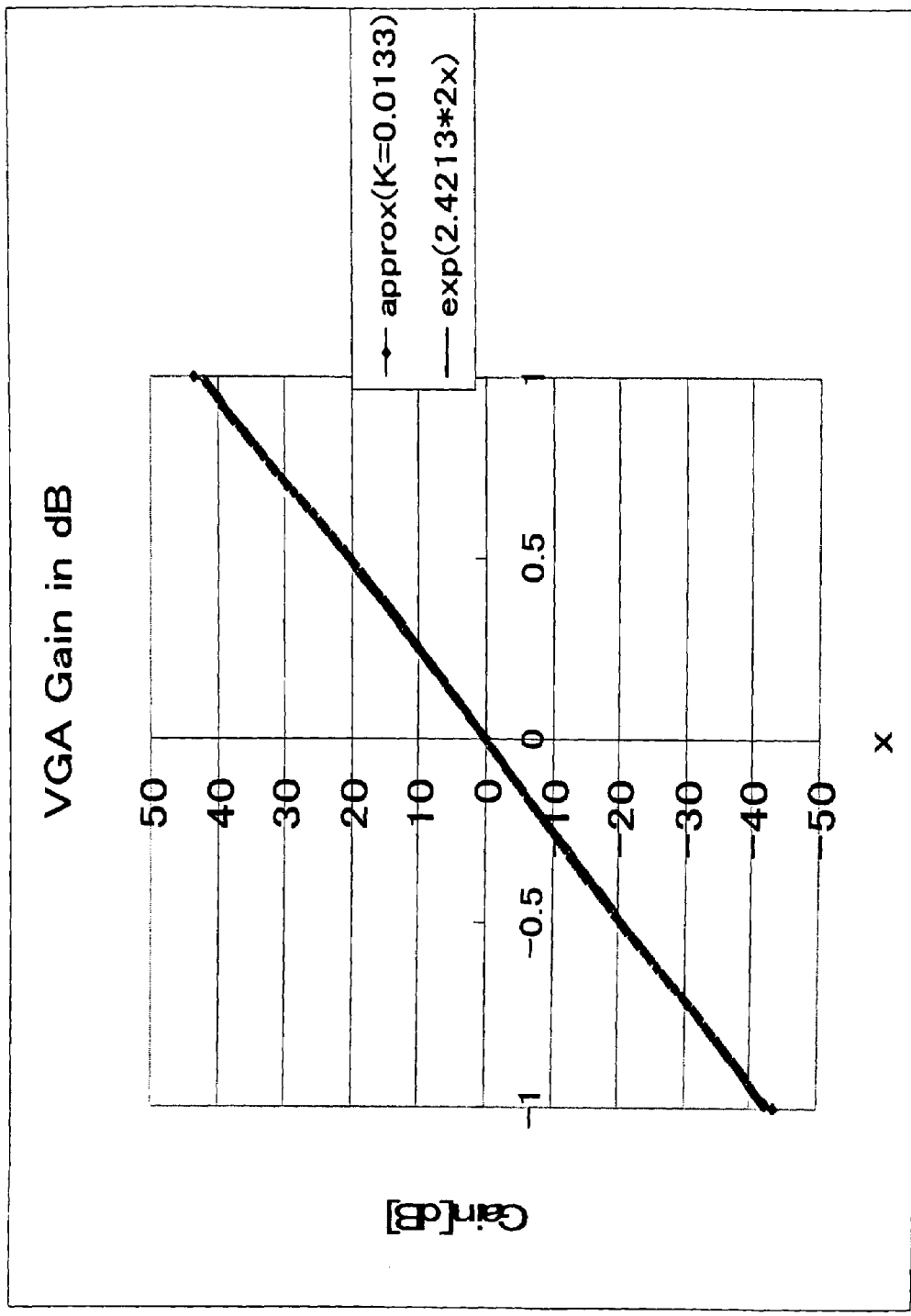
FIG. 4 is a graph for illustrating a second approximation used in the present invention.

In a MOS circuit, the square root ($\sqrt{}$) of the driving current of an OTA is proportionate to gm (transconductance) of the OTA. Thus, if the OTA is in a MOS circuit configuration, the tilt shown in FIGS. 3 and 4 is reduced to one-half. Thus, a variable width of the order of ±18.3 dB or ±20.8 dB may be achieved. However, the OTA's driving current ratio is on the order of 1:100. Thus, to assure the operating input voltage range, it is necessary for the minimum driving current to be of a reasonably high value, such that it is difficult to achieve the low current.

The drain current $I_D$ of a MOS transistor may be expressed by the following equation:

$$I_D = \beta(V_{GS} - V_{TH})^2 \quad (18)$$

where $\beta$ is a transconductance parameter of a unit transistor and may be expressed by $$\beta = \mu\left(\frac{W}{L}\right) \quad (19)$$

where μ denotes electron mobility and W, L denote the gate width and the gate length of the unit transistor, respectively.

It may appear to be difficult to implement the equation (13) using a MOS transistor.

Such is not the case if the back-gate voltage of the MOS transistor is made variable. The threshold voltage $V_{TH}$ of the MOS transistor depends on the back-gate voltage and may be expressed by $$V_{TH} = V_{TH0} + \gamma(\sqrt{2|\phi_F| - V_{BS}} - \sqrt{2|\phi_F|}) \quad (20)$$

where γ is a bulk threshold parameter, $V_{BS}$ is a substrate-source voltage and $\phi_F$ denotes a strong inversion surface potential. $V_{TH0}$ is a threshold voltage for the substrate-source voltage $V_{BS}$ equal to 0V (substrate potential=source potential).

Thus, when differential voltages ($V_{CN} + V_{CNT}$ and $V_{CN} - V_{CNT}$) are applied as back-gate voltages of the two MOS transistors, the drain currents $I_{D1}$, $I_{D2}$ of the two MOS transistors are given by $$I_{D1} = \beta\left[V_{GS} - V_{TH0} - \gamma\left\{\sqrt{2|\phi_F| - (V_{CM} + V_{CNT})} - \sqrt{2|\phi_F|}\right\}\right]^2 \quad (21)$$

and $$I_{D2} = \beta\left[V_{GS} - V_{TH0} - \gamma\left\{\sqrt{2|\phi_F| - (V_{CM} - V_{CNT})} - \sqrt{2|\phi_F|}\right\}\right]^2 \quad (22)$$

respectively.

A bias current $I_K$ is added to the control current and the following equation may be derived:

$$\frac{I_{CON1}}{I_{CON2}} = \frac{I_{D1} + I_K}{I_{D2} + I_K} \quad (23)$$

$$= \frac{\beta\left[\gamma\left\{\frac{\sqrt{2|\phi_F| - (V_{CM} + V_{CNT})} - }{\sqrt{2|\phi_F|}}\right\}\right]^2 + I_K}{\beta\left[\gamma\left\{\frac{\sqrt{2|\phi_F| - (V_{CM} - V_{CNT})} - }{\sqrt{2|\phi_F|}}\right\}\right]^2 + I_K}$$

For further simplification, $$V_{GS} = V_{TH0} \quad (24)$$

is set.

The equation (23) is rewritten and expressed as follows:

$$\frac{I_{CON1}}{I_{CON2}} = \frac{\beta\left[-\gamma\left\{\frac{\sqrt{2|\phi_F| - (V_{CM} + V_{CNT})} - }{\sqrt{2|\phi_F|}}\right\}\right]^2 + I_K}{\beta\left[-\gamma\left\{\frac{\sqrt{2|\phi_F| - (V_{CM} - V_{CNT})} - }{\sqrt{2|\phi_F|}}\right\}\right]^2 + I_K} \quad (25)$$

$$= \frac{\left\{\frac{\sqrt{2|\phi_F| - (V_{CM} + V_{CNT})} - }{\sqrt{2|\phi_F|}}\right\}^2 + \frac{I_K}{\beta\gamma^2}}{\left\{\frac{\sqrt{2|\phi_F| - (V_{CM} - V_{CNT})} - }{\sqrt{2|\phi_F|}}\right\}^2 + \frac{I_K}{\beta\gamma^2}}$$

-continued $$= \frac{\left[\sqrt{1 - \frac{V_{CNT}}{2|\phi_F| - V_{CM}}} - 1\right]^2 + \frac{I_K}{\beta\gamma^2(2|\phi_F| - V_{CM})}}{\left[\sqrt{1 + \frac{V_{CNT}}{2|\phi_F| - V_{CM}}} - 1\right]^2 + \frac{I_K}{\beta\gamma^2(2|\phi_F| - V_{CM})}}$$

By setting $V_{CM} = |\phi_F|$ (26)

we obtain $$\frac{I_{CON1}}{I_{CON2}} = \frac{\left[\sqrt{1 - \frac{V_{CNT}}{|\phi_F|}} - \sqrt{2}\right]^2 + \frac{I_K}{\beta\gamma^2|\phi_F|}}{\left[\sqrt{1 + \frac{V_{CNT}}{|\phi_F|}} - \sqrt{2}\right]^2 + \frac{I_K}{\beta\gamma^2|\phi_F|}}$$ (27)

Thus, by setting $$x = \frac{V_{CNT}}{|\phi_F|}$$ (28)

and also by setting $$K = \frac{I_K}{\beta\gamma^2|\phi_F|}$$ (29)

in the equation (27), the function of the equation (12) is obtained.

Figure 6:
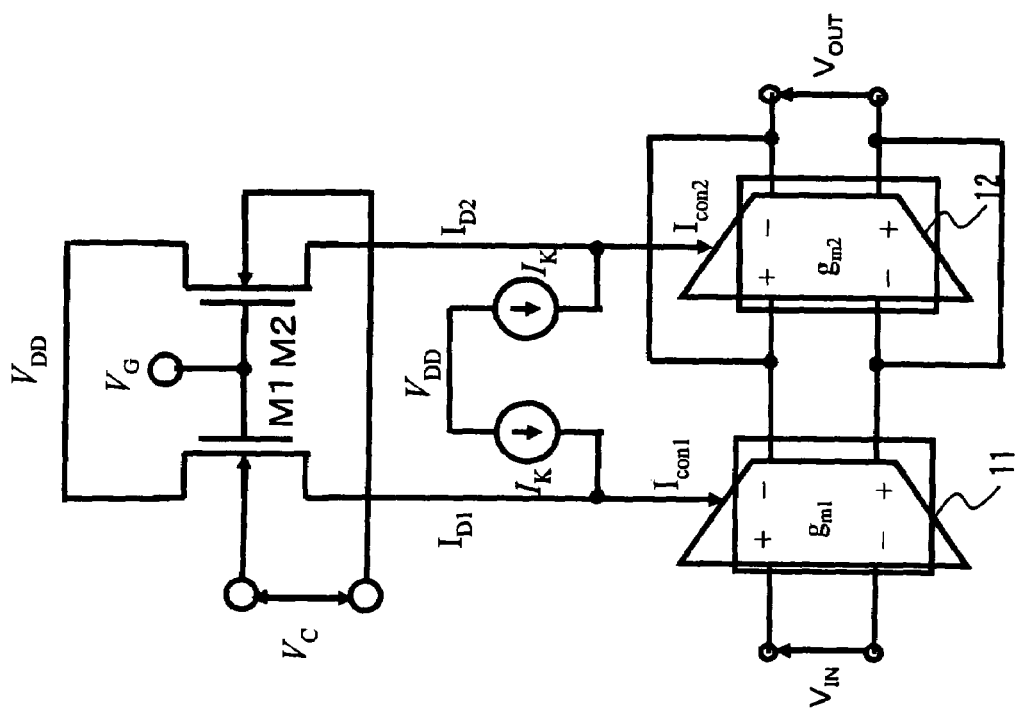
FIG. 6 is a diagram showing a configuration of a circuit as used in an example of the present invention.

An example of an implementing circuit is shown in FIG. 6, from which it may be seen that the circuit size has now been made astonishingly smaller than that of the circuits so far indicated.

In more detail, the variable gain circuit of the present example, shown in FIG. 6, includes a first OTA 11, a second OTA 12 and p-ch MOS transistors M1 and M2. The first OTA differentially receives an input voltage $V_{IN}$ by its first and second input terminals, and the second OTA includes first and second input terminals, connected to first and second output terminals of the first OTA 11, respectively, and first and second output terminals. The second OTA has its first input terminal connected to its first output terminal, while having its second input terminal connected to its second output terminal. The p-ch MOS transistors M1 and M2 have sources connected common and connected to a power supply VDD, while having back-gates differentially supplied with control voltages VC ($V_{CN}+V_{CNT}$ and $V_{CN}-V_{CNT}$). A sum current $I_{D1}+I_K$, where $I_{D1}$ is a drain current of the MOS transistor M1 and $I_K$ is a constant current, is supplied as a control current $I_{CON1}$ to the first OTA 11. A sum current $I_{D2}+I_K$, where $I_{D2}$ is a drain current of the MOS transistor M2 and $I_K$ is the constant current, is supplied as a control current $I_{CON2}$ to the second OTA 12. The ratio of $I_{CON1}$ to $I_{CON2}$ is given by the above equation (27), while being given by the equation (12) from the equations (28) and (29).

Thus, if the OTA circuit is bipolar, the gain characteristics, shown in FIGS. 3 and 4, may be achieved.

If the OTA circuit is a MOS circuit, the gain and the approximation error, expressed in dB, are compressed by one half in terms of dB values in the gain characteristics shown in FIGS. 3 and 4.

The operation is now confirmed by SPICE simulation. In this SPICE simulation, 0.35 μm process device parameters are used.

Figure 7:
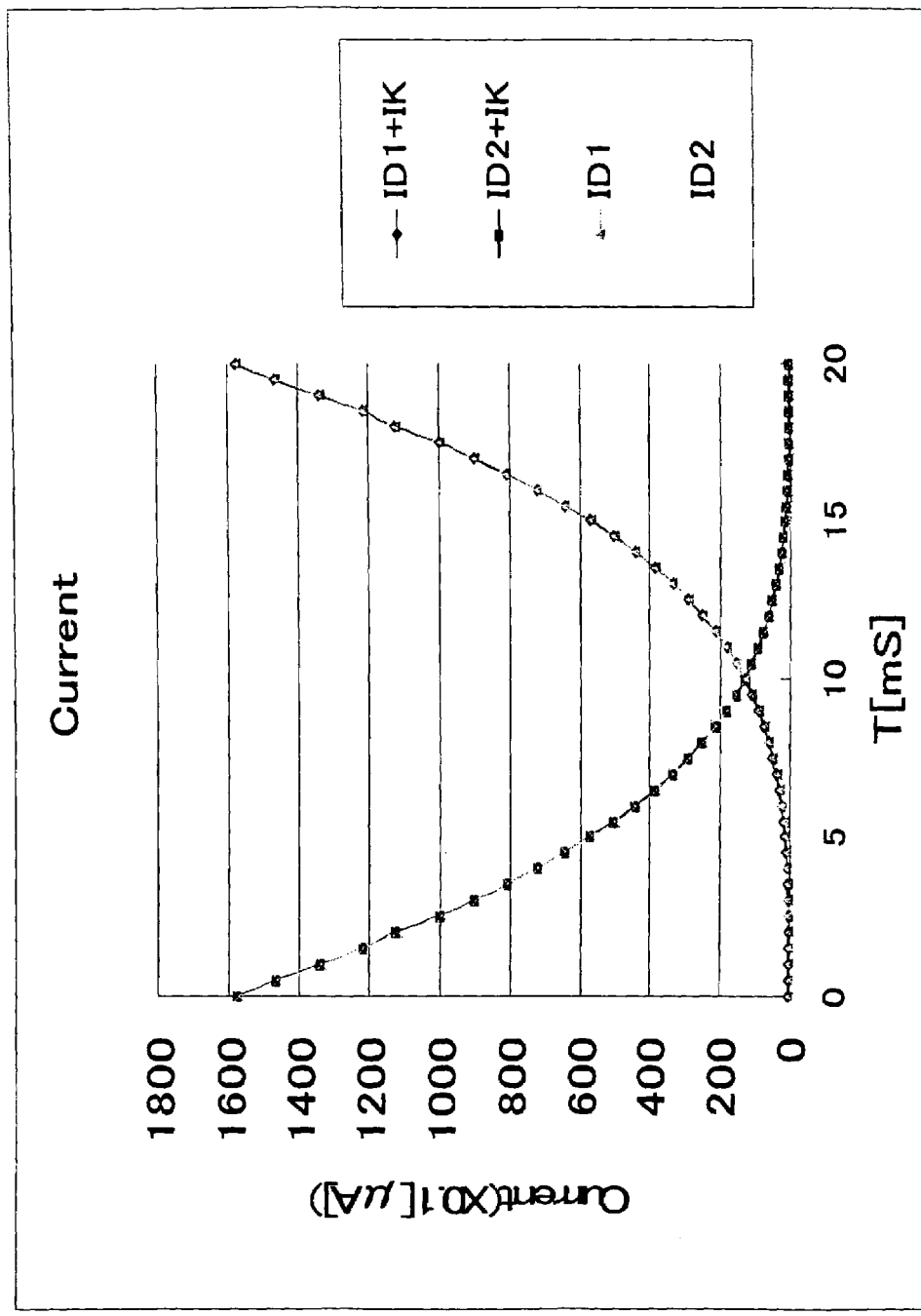
FIG. 7 is a graph showing characteristics (simulated values) of two control currents as obtained from an example of the present invention.

FIG. 7 shows, for a control circuit that makes use of a transistor receiving an input at its back-gate, the simulated values of drain currents $I_{D1}$, $I_{D2}$ of the MOS transistors M1 and M2 and the two control currents $I_{CON1}$ (=$I_{D1}+I_K$) and $I_{CON2}$ (=$I_{D2}+I_K$) in case W/L of the p-ch MOS transistors M1 and M2 is set to 100 μm/1 μm and $I_K$ is set to 0.245 μA. It is noted that VDD=3V, the gate bias voltage VG of the p-ch MOS transistors M1 or M2 is 2.5V (VG=2.5V), and that the control voltage VC differentially supplied to the transistor back-gates is varied from 3V to 1V or from 1V to 3V (2V±1V) for time since 0 mS until 20 mS. That is, with the control voltage VC ($V_{CM}+V_{CNT}$, $V_{CM}-V_{CNT}$), differentially applied to the back-gates of the transistors M1 and M2, the common mode voltage $V_{CM}$ is set to 2V, and $V_{CNT}$ is varied from 1V to −1V, such that, at time points 0 mS, 10 mS and 20 mS on the time axis of FIG. 7, ($V_{CM}+V_{CNT}$, $V_{CM}-V_{CNT}$)= (3V, 1V), (2V, 2V) and (1V, 3V), respectively.

Figure 8:
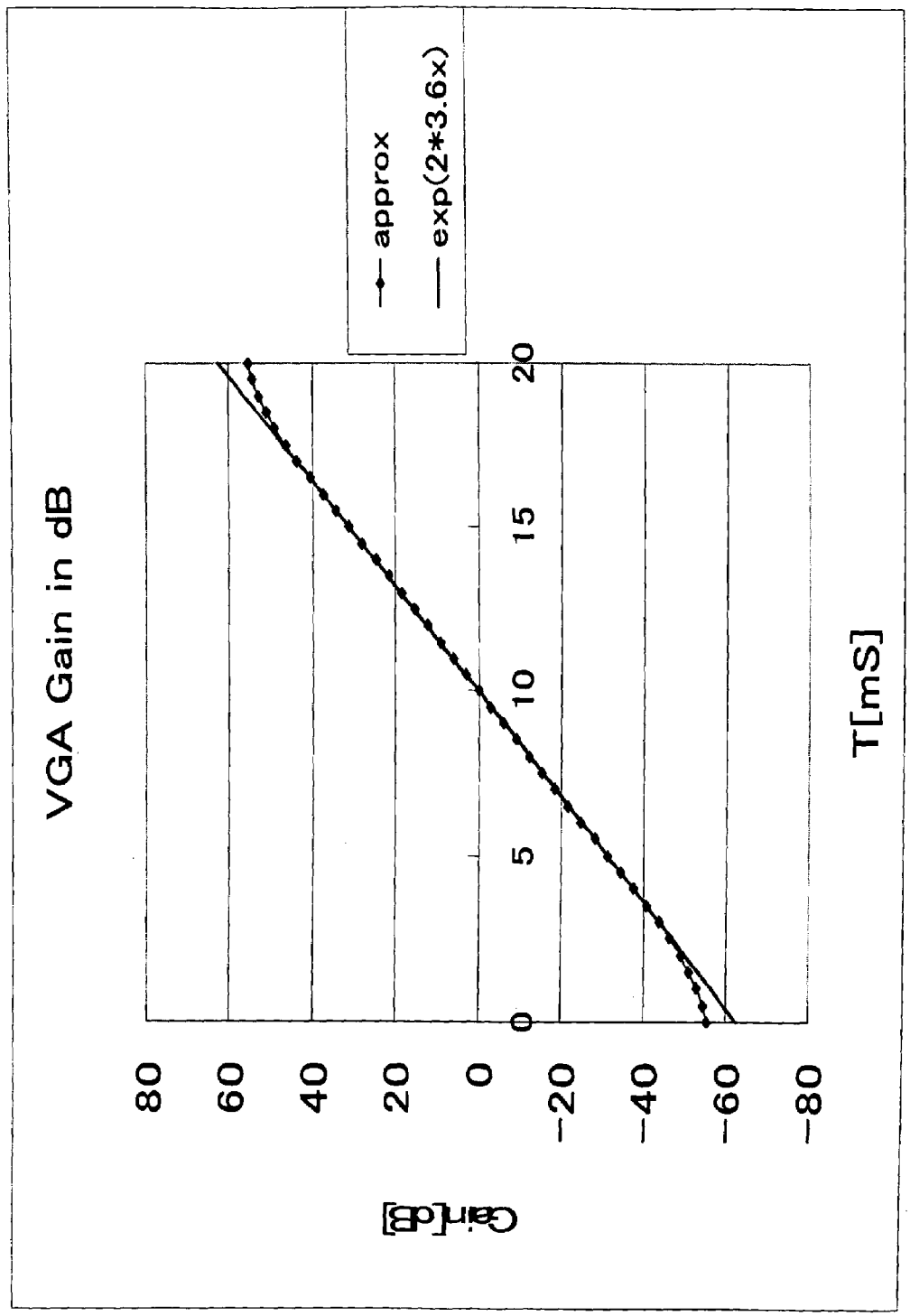
FIG. 8 is a graph showing characteristics (simulated values) as obtained from an example of the present invention.

FIG. 8 is a graph showing characteristics (simulated values) of an example of the present invention, specifically, a graph showing plots of the gain Gain=$I_{CON1}/I_{CON2}$. As in FIG. 7, the abscissa denotes time (mS). The control voltage VC, differentially supplied to the transistor back-gates, is varied from 3V to 1V and from 1V to 3V (2V±1V) for time since 0 mS until 20 mS. The ordinate stands for the gain in dB. It is noted that the OTA 11 and the OTA 12 of FIG. 6 are bipolar devices.

The approximate characteristics (approx) obtained approximate exp(2*3.6x) which is a solid line of FIG. 8. The width of the approximate error is not greater than ±0.23 dB and the gain width of 88 dB (±44 dB) is assured.

The simulated values of the characteristics of the drain currents $I_{D1}$ and $I_{D2}$ of the MOS transistors M1 and M2 and the control currents $I_{CON1}$ (=$I_{D1}+I_K$) and $I_{CON2}$ (=$I_{D2}+I_K$) are shown in FIG. 7 for the values for K of the equations (29) and (12)=0.191556.

With the present example, described above, there is provided a variable gain circuit in which the approximation error is small, the gain is exponentially varied with respect to a control voltage applied to the back-gates of the MOS transistors, the operation is from a low voltage and both the range of the operation and the dynamic range are broad, and which may be formed to advantage on a semiconductor integrated circuit.

Among practical examples of use of the present invention, there is a use as a high-gain variable gain circuit in a baseband or in an IF band as used in an RF chip of a mobile terminal.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A variable gain circuit which operates in a region in which a gain thereof varies substantially as an exponential function of a control voltage applied thereto, the circuit having an operation region, wherein the gain varies substantially exponentially, based on a function $$\{(\sqrt{1-x}-\sqrt{2})^2+K\}/\{(\sqrt{1+x}-\sqrt{2})^2+K\} \ (0 \leq K \leq 1)$$

where x is a variable corresponding to the control voltage.

2. The variable gain circuit according to claim 1, wherein a parameter K in the function is of a value of approximately from 0.01 to 0.03 including 0.0133 or 0.026.

3. The variable gain circuit according to claim 1, comprising:
   first and second OTAs (operational transconductance amplifiers), the denominator and the numerator of the function being proportionate to driving currents of the first and second OTAs, respectively.

4. The variable gain circuit according to claim 1, comprising:
   first and second MOS transistors, having sources coupled together and connected to a power supply, having gates coupled together and supplied with a common bias voltage, and having back-gates supplied with differential input voltages,
   wherein the denominator and the numerator of the function correspond to a sum current of a drain current of the first MOS transistor and a constant current and to a sum current of a drain current of the second MOS transistor and the constant current, respectively.

5. A variable gain circuit comprising:
   a first OTA (operational transconductance amplifier) which differentially receives an input voltage at first and second input terminals thereof;
   a second OTA (operational transconductance amplifier) which has first and second input terminals thereof connected to first and second output terminals of the first operational transconductance amplifier, respectively,
   the first input terminal and a first output terminal of the second OTA being connected to each other; the second input terminal and a second output terminal of the second OTA being connected to each other,
   the gain of the variable gain circuit being given by gm1/gm2, where gm1 is the transconductance of the first OTA and gm2 is the transconductance of the second OTA, and the transconductance of each of the OTAs being proportionate to a driving current for each OTA or a square root thereof; and
   first and second MOS transistors, having sources coupled together and connected to a power supply, having gates supplied with a common bias voltage, and having back-gates differentially supplied with control voltages;
   the sum of a drain current of the first MOS transistor and a constant current being supplied as a first driving current to the first OTA;
   the sum of a drain current of the second MOS transistor and the constant current being supplied as a second driving current to the second OTA.

6. The variable gain circuit according to claim 5, wherein, assuming that
   the control voltages differentially supplied to the back-gates of the first and second MOS transistors are $V_{CN}+V_{CNT}$ and $V_{CN}-V_{CNT}$, respectively,
   the first driving current corresponding to the sum of the drain current $I_{D1}$ of the first MOS transistor and the constant current $I_K$ is $I_{CON1}$, and
   the second driving current corresponding to the sum of the drain current $I_{D2}$ of the second MOS transistor and the constant current $I_K$ is $I_{CON2}$,
   the ratio of $I_{CON1}$ to $I_{CON2}$ is given by $$\frac{I_{CON1}}{I_{CON2}} = \frac{\left[\sqrt{1-\frac{V_{CNT}}{|\phi_F|}} - \sqrt{2}\right]^2 + \frac{I_K}{\beta\gamma^2|\phi_F|}}{\left[\sqrt{1+\frac{V_{CNT}}{|\phi_F|}} - \sqrt{2}\right]^2 + \frac{I_K}{\beta\gamma^2|\phi_F|}}$$

where $\phi_F$ is the strong inversion surface potential, $\beta$ is a gain coefficient and $\gamma$ is a bulk threshold parameter.

7. The variable gain circuit according to claim 6, wherein, by putting $$x = \frac{V_{CNT}}{|\phi_F|}$$

and $$K = \frac{I_K}{\beta\gamma^2|\phi_F|}$$

$I_{CON1}/I_{CON2}$ is given by
$$\{(\sqrt{1-x}-\sqrt{2})^2+K\}/\{(\sqrt{1+x}-\sqrt{2})^2+K\}$$
where $0 \leq K \leq 1$.

8. The variable gain circuit according to claim 5, wherein the threshold voltage $V_{TH}$ of the MOS transistor is represented by
$$V_{TH}=V_{TH0}+\gamma\{\sqrt{(2|\phi_F|-V_{BS})}-\sqrt{(2|\phi_F|)}\}$$
where $\gamma$ is a bulk threshold parameter, $V_{BS}$ is a substrate-source voltage, $\phi_F$ is a strong inversion surface potential and $V_{TH0}$ is a threshold voltage for the substrate-source voltage $V_{BS}=0V$;
   the gate-source voltages of the first and second MOS transistors being set to the threshold voltage $V_{TH0}$; and wherein
   the common mode voltage $V_{CN}$ of the control voltages, differentially supplied to the back-gates of the first and second MOS transistors, is $|\phi_F|$ where $\phi_F$ is the strong inversion surface potential.

9. A semiconductor device including the variable gain circuit as set forth in claim 1.

* * * * *